United States Patent
Smith

(10) Patent No.: US 9,453,614 B2
(45) Date of Patent: Sep. 27, 2016

(54) SYSTEMS AND METHODS FOR COOLING AND REMOVING REACTANTS FROM A SUBSTRATE PROCESSING CHAMBER

(71) Applicant: LAM RESEARCH CORPORATION, Fremont, CA (US)

(72) Inventor: Colin F. Smith, Half Moon Bay, CA (US)

(73) Assignee: LAM RESEARCH CORPORATION, Fremont, CA (US)

(*) Notice: Subject to any disclaimer, the term of this patent is extended or adjusted under 35 U.S.C. 154(b) by 271 days.

(21) Appl. No.: 14/215,910

(22) Filed: Mar. 17, 2014

(65) Prior Publication Data

US 2015/0260350 A1 Sep. 17, 2015

(51) Int. Cl.
*H01L 21/67* (2006.01)
*F17D 3/16* (2006.01)

(52) U.S. Cl.
CPC ............ *F17D 3/16* (2013.01); *H01L 21/67017* (2013.01); *H01L 21/67167* (2013.01); *H01L 21/67184* (2013.01); *Y10T 137/0402* (2015.04); *Y10T 137/794* (2015.04); *Y10T 137/87587* (2015.04); *Y10T 137/87627* (2015.04)

(58) Field of Classification Search
CPC ................. F17D 3/16; Y10T 137/794; Y10T 137/0402; Y10T 137/87587; Y10T 137/87627; H01L 21/67017; H01L 21/67184; H01L 21/67167; C23C 16/46–16/463; H01J 37/32449
USPC ......... 137/888, 893; 55/385.1, 385.4; 95/14, 95/19, 23; 96/420–422; 118/719, 118/724–725; 156/345.29
See application file for complete search history.

(56) References Cited

U.S. PATENT DOCUMENTS

| | | | | |
|---|---|---|---|---|
| 4,721,126 A * | 1/1988 | Horii | ...................... | B65G 53/58 137/1 |
| 7,208,389 B1 * | 4/2007 | Tipton | .............. | H01L 21/02126 257/E21.273 |
| 8,591,659 B1 * | 11/2013 | Fang | .................. | H01J 37/32357 134/1.1 |
| 2003/0066606 A1 * | 4/2003 | Clarke | .................. | C23C 14/564 156/345.32 |
| 2003/0194493 A1 * | 10/2003 | Chang | ............... | C23C 16/45512 427/248.1 |
| 2004/0141410 A1 * | 7/2004 | Fenton | ...................... | F04F 5/24 366/163.2 |
| 2005/0006230 A1 * | 1/2005 | Narushima | ....... | H01L 21/67017 204/298.2 |

* cited by examiner

*Primary Examiner* — Craig Schneider
*Assistant Examiner* — Josephine Trinidad-Borges

(57) ABSTRACT

A cooling and reactant removal system includes first and second gate valves. An outlet of the first gate valve is arranged in fluid communication with the process volume of the processing chamber. A filter is arranged in fluid communication with an inlet of the first gate valve. An inlet of the second gate valve is arranged in fluid communication with the process volume of the processing chamber. A gas amplifier has a first inlet, a second inlet, an outlet and at least one Coanda surface. Compressed gas received at the first inlet of the gas amplifier is directed across the Coanda surface. The second inlet of the gas amplifier is in fluid communication with the outlet of the second gate valve. The outlet of the gas amplifier is in fluid communication with a scrubbed exhaust system.

20 Claims, 4 Drawing Sheets

SYSTEMS AND METHODS FOR COOLING AND REMOVING REACTANTS FROM A SUBSTRATE PROCESSING CHAMBER

FIELD

The present disclosure relates to substrate processing chambers, and more particularly to systems and methods for cooling and removing reactants from a substrate processing chamber prior to maintenance.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Semiconductor processing systems are used to deposit and etch film on substrates such as semiconductor wafers. The semiconductor processing systems include a processing chamber including one or more pedestals for supporting substrates. During processing of the substrates, the pedestals are typically heated. One or more gas mixtures each including one or more process gases may be introduced into the processing chamber and plasma may also be used. When a process is complete, reactants are removed from the processing chamber using purging or evacuation.

Periodically, maintenance is performed on the processing chamber. Prior to performing the maintenance, components of the processing chamber need to cool and reactants need to be completely removed from the processing chamber.

Some substrate processing systems remove reactants by venting the processing chamber to atmosphere using ambient air, pumping to base and then repeating one or more additional times. As used herein, the pump to base includes pumping the processing chamber to a base vacuum pressure usually within a predetermined period. For example only, the pump to base step may have a vacuum pressure that is less than vacuum pressure of a preceding and/or subsequent step. After removing the reactants, the processing chamber is typically left partially open and the processing chamber is allowed to cool.

SUMMARY

A cooling and reactant removal system for a semiconductor processing system includes a processing chamber defining a process volume and comprising one or more pedestals configured to support one or more substrates, respectively, for processing. A first gate valve has an inlet and an outlet. The outlet of the first gate valve is arranged in fluid communication with the process volume of the processing chamber. A filter is arranged in fluid communication with the inlet of the first gate valve. A second gate valve has an inlet and an outlet. The inlet of the second gate valve is arranged in fluid communication with the process volume of the processing chamber. A gas amplifier has a first inlet, a second inlet, an outlet and at least one Coanda surface. The first inlet of the gas amplifier is in fluid communication with a compressed source of gas. The compressed gas received at the first inlet is directed across the Coanda surface. The second inlet of the gas amplifier is in fluid communication with the outlet of the second gate valve. The outlet of the gas amplifier is in fluid communication with a scrubbed exhaust system.

In other features, a vent system vents the processing chamber. A humidity system selectively supplies fluid to the filter during operation of the gas amplifier. The humidity system includes a fluid supply, a valve in fluid communication with the fluid supply, and a nozzle in fluid communication with the valve and arranged to spray fluid from the fluid supply onto the filter.

In other features, the source of compressed gas supplies at least one of clean dry air, inert gas, atmospheric air and molecular nitrogen. The source of compressed fluid operates between 50 and 100 psig. The source of compressed gas operates at approximately 60 to 100 psig. The gas amplifier operates at an amplification ratio between 8:1 and 37:1.

In other features, one or more heaters heat the one or more pedestals, respectively. A controller is configured to turn off the heaters, vent the processing chamber, open the second gate valve, supply the compressed gas to the first inlet of the gas amplifier, and open the first gate valve.

In other features, the controller is further configured to compare a temperature of the processing chamber to a predetermined temperature. Based on the comparing, the controller is configured to turn off the compressed gas to the gas amplifier and close the first and second gate valves.

A method for cooling and removing reactants from a semiconductor processing system including a processing chamber defining a process volume and including one or more pedestals configured to support one or more substrates, respectively, for processing, includes connecting an outlet of a first gate valve to the process volume of the processing chamber; connecting a filter to an inlet of the first gate valve; connecting an inlet of a second gate valve to the process volume of the processing chamber; connecting a first inlet of a gas amplifier to a source of compressed gas, wherein the compressed gas received at the first inlet is directed across a Coanda surface of the gas amplifier; connecting a second inlet of the gas amplifier to the outlet of the second gate valve; and connecting an outlet of the gas amplifier to a scrubbed exhaust system.

In other features, the method includes selectively venting the processing chamber. The method includes selectively supplying liquid to the filter during operation of the gas amplifier. The source of compressed gas supplies at least one of clean dry air, inert gas, atmospheric air and molecular nitrogen. The source of compressed gas operates between 50 and 100 psig. The source of compressed gas operates at approximately in a range between 60 psig to 100 psig. The gas amplifier operates at an amplification ratio between 8:1 and 37:1.

In other features, the method includes turning off heat to the pedestals; venting the processing chamber; opening the second gate valve; supplying the compressed gas to the first inlet of the gas amplifier; and opening the first gate valve. The method includes comparing a temperature of the processing chamber to a predetermined temperature; and, based on the comparing, turning off the compressed gas to the gas amplifier; and closing the first and second gate valves.

In other features, the method includes pumping to base pressure and venting the processing chamber.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to systems and methods for cooling and removing reactants from a substrate processing chamber. The systems and methods described herein accelerate both the process chamber cool down and reactant removal time from the processing chamber prior to maintenance.

The cooling and reactant removal system includes a gas amplifier with a Coanda nozzle that draws a large volume of gas such as atmospheric air, inert gas, molecular nitrogen or clean dry air (CDA) past heated components and surfaces within the processing chamber. In some examples, the gas output by the gas amplifier is routed to a scrubbed exhaust system. Because a large amount of gas is being drawn through the processing chamber, removal of reactants can occur at the same time as the processing chambers cools down.

Figure 1:
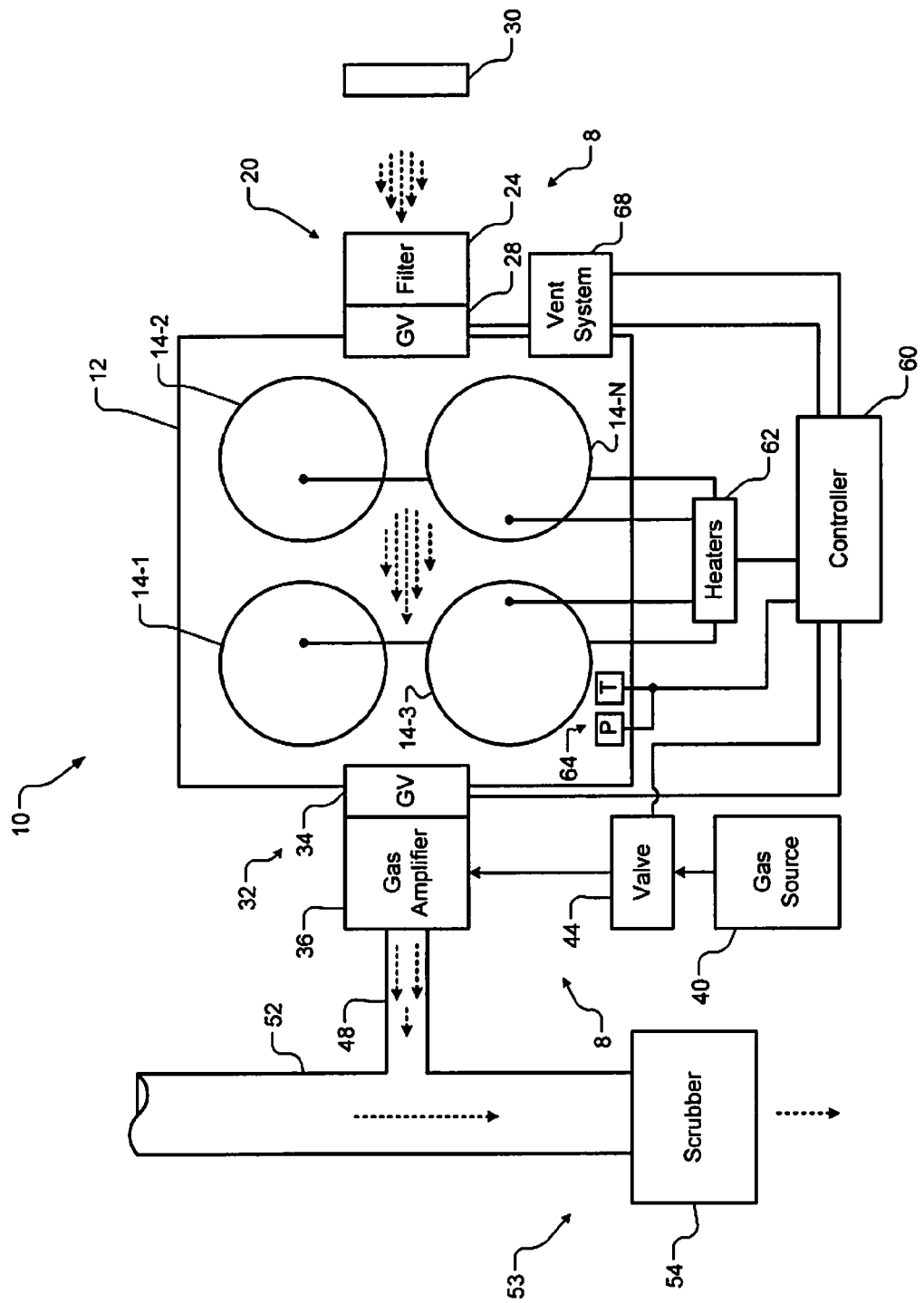
FIG. 1 is a functional block diagram of an example of a cooling and reactant removal system for a substrate processing system according to the present disclosure.

Referring now to FIG. 1, an example of a cooling and reactant removal system 8 for a substrate processing system 10 is shown. The substrate processing system 10 includes a processing chamber 12 that defines a process volume and includes one or more pedestals 14-1, 14-2, . . . , and 14-N (collectively pedestals 14). During processing, substrates are arranged on the pedestals 14.

The cooling and reactant removal system 8 includes an inlet 20 including a filter 24 and a gate valve 28. The filter 24 is used to limit particle incursion into the processing chamber 12. A cover 30 may be positioned over an inlet side of the filter 24 to block flow into the filter during normal operation of the substrate processing system 10 and is removed to allow flow when maintenance is needed. An outlet side of the filter 24 communicates with an inlet of the gate valve 28. An outlet side of the gate valve 28 communicates with an interior volume of the substrate processing chamber 10.

The cooling and reactant removal system 8 further includes an outlet 30 that includes a gate valve 34 and a gas amplifier 36. A gas source 40 for gas such as atmospheric air, inert gas, molecular nitrogen or clean dry air (CDA) is connected by a valve 44 to a first inlet of the gas amplifier 36. An inlet of the gate valve 34 communicates with the interior volume of the substrate processing chamber 12. An outlet of the gate valve 34 communicates with a second inlet of the gas amplifier 36. An outlet of the gas amplifier 36 communicates with a conduit 48. The conduit 48 communicates with a conduit 52. In some examples, the conduit 52 is part of or connected to a scrubbed exhaust system 53 that includes a scrubber 54 to clean gas and other particulates in the exhaust before release.

A controller 60 controls operation of one or more heaters 62, which are used to control temperatures of the pedestals 14, respectively. The controller 60 also monitors operating parameters of the substrate processing system 10, such as but not limited to processing chamber pressure and temperature, using sensors collectively identified at 64. The controller 60 may also communicate with a vent system 68 to vent the processing chamber 10 as needed.

Figure 2:
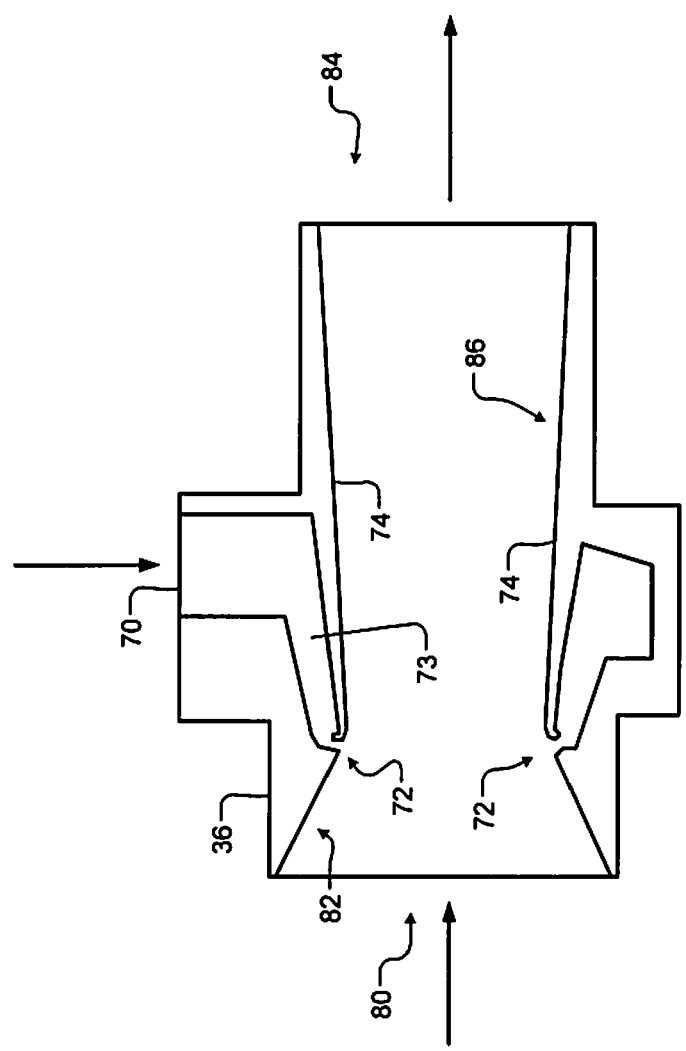
FIG. 2 is a cross-sectional view of an example of a gas amplifier.

Referring now to FIG. 2, an example of the gas amplifier 36 is shown. Compressed gas enters an annular chamber at the first inlet 70 and passes through a ring nozzle 73 at high velocity. The compressed gas travels into the inside of the gas amplifier 36 and over a Coanda profile 72. The compressed gas stream clings to the Coanda profile 72 and flows along inside walls 74 of the gas amplifier 36. Vacuum is created that induces gas from the process volume into the second inlet 80 of the gas amplifier 36 with a multiplying effect. Amplified airflow exits the gas amplifier at an outlet 84 of the gas amplifier 36. In some examples, the compressed gas has a pressure of approximately 50-100 psig. For example, the pressure of the compressed gas may be set to 60 to 100 psig. The flow through the chamber can be varied by changing the air pressure. In some examples, portions of the gas amplifier 36 that are exposed to gas and particulates from the processing chamber 12 are made of stainless steel.

Figure 3:
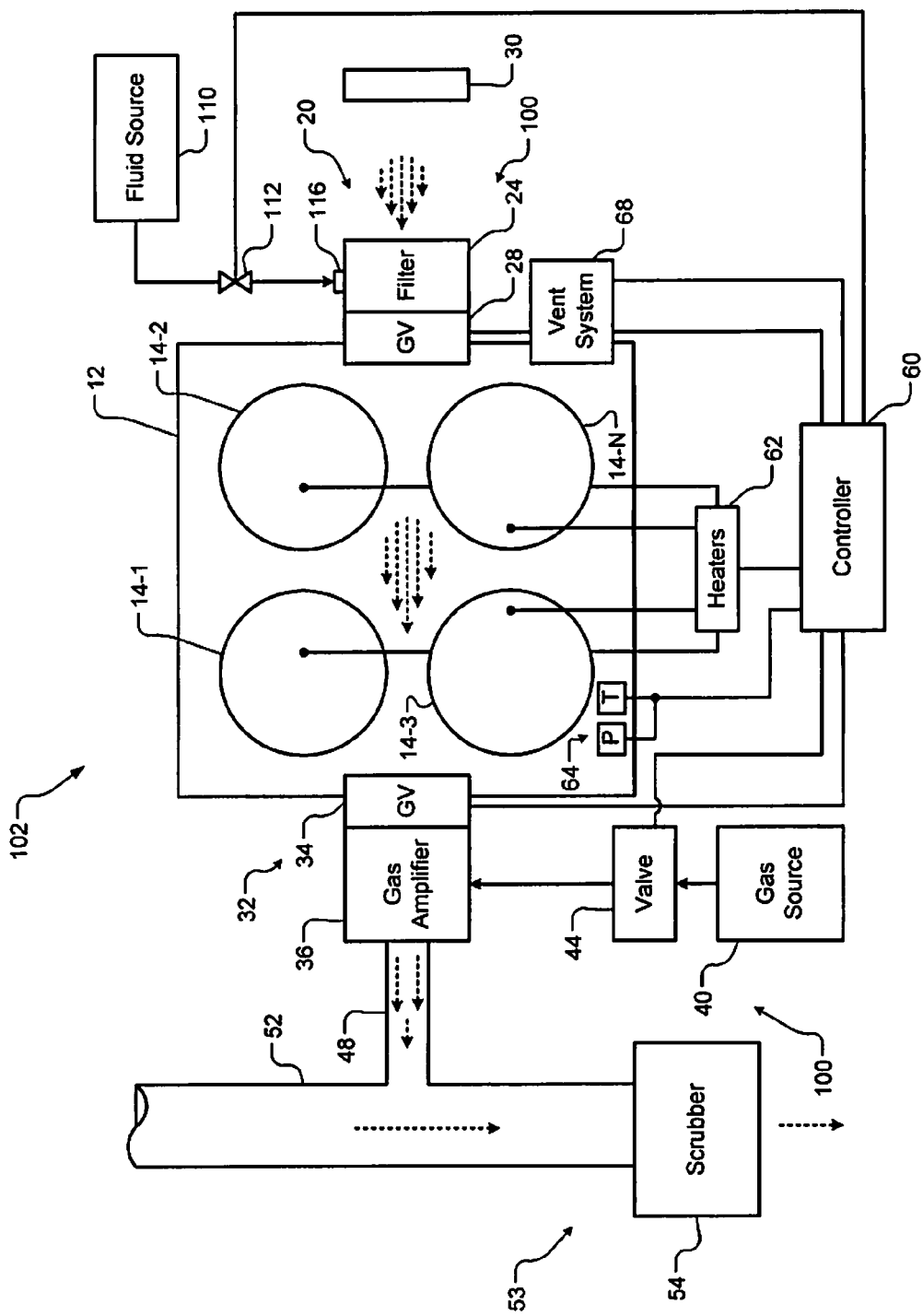
FIG. 3 is a functional block diagram of another example of a cooling and reactant removal system for a substrate processing system according to the present disclosure.

Referring now to FIG. 3, another example of a cooling and reactant removal system 100 for a substrate processing system 102 is shown. The cooling and reactant removal system 100 is similar to the cooling and reactant removal system 10 in FIG. 1. However, the cooling and reactant removal system 100 includes a fluid source 110 that supplies fluid that is sprayed on the filter to increase humidity in the substrate processing chamber. For example only, the fluid source 110 may provide fluid via a valve 112 and a nozzle 116 onto surfaces of the filter 24. For example only, the fluid may include water, deionized (DI) water or other fluid. For example only, residual fluorine may be left in the process chamber. By adding DI water or atmospheric moisture, the fluorine combines with the available hydrogen and become HF. HF is more volatile and easier to remove than fluorine from the process chamber. Adding DI water to the filter 24 while the air amplifier is drawing air through the filter will draw more water into the chamber and accelerate the conversion of fluorine to HF.

Figure 4:
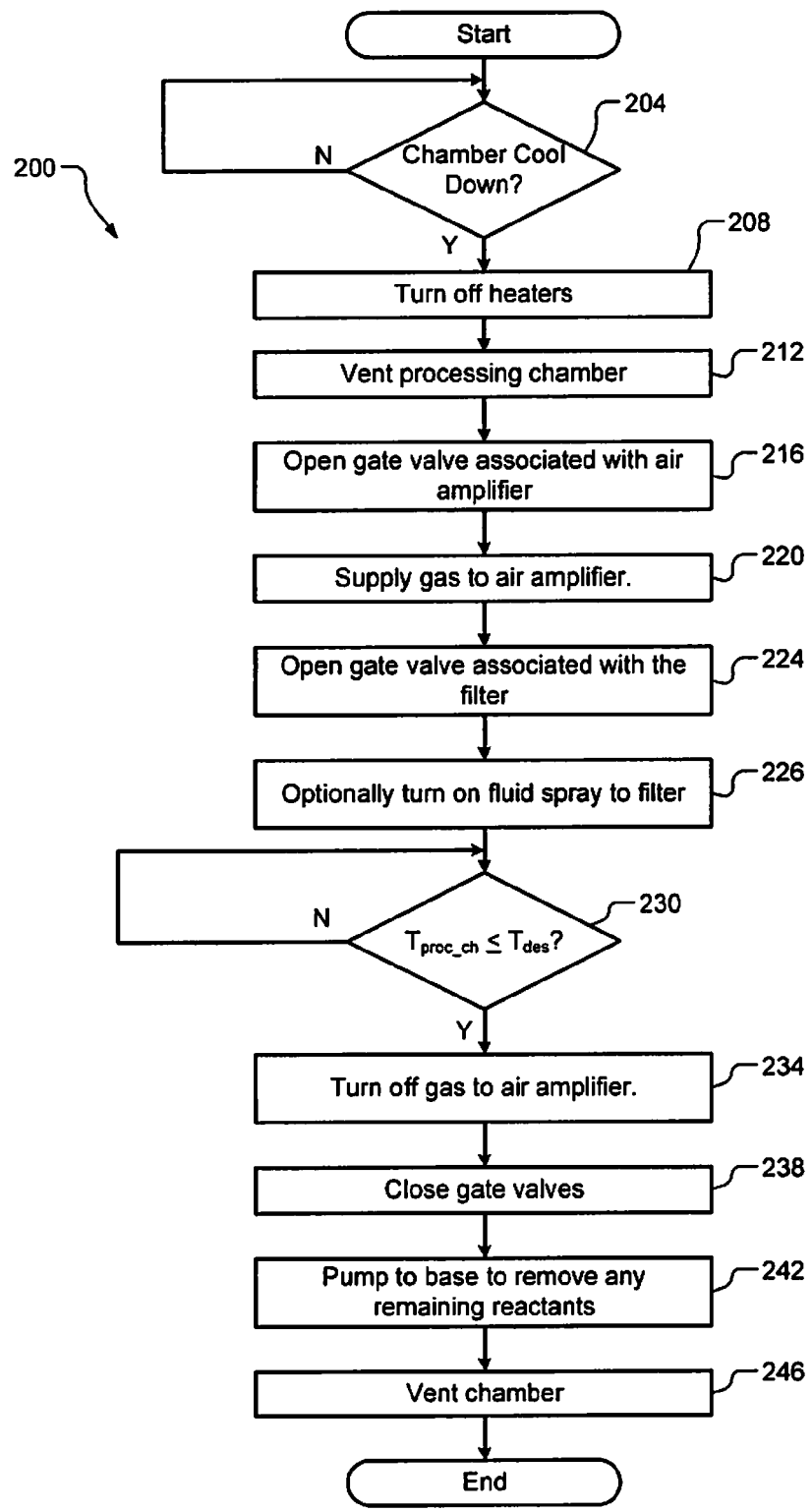
FIG. 4 illustrates an example of a method for operating the cooling system for the substrate processing system.

Referring now to FIG. 4, an example of a method 200 for operating the cooling and reactant removal system for the substrate processing system is shown. At 204, control determines whether chamber cool down is requested. If 204 is true, control turns off the heaters at 208. At 212, the processing chamber is vented. At 216, the gate valve associated with the gas amplifier is opened. At 220, compressed fluid is supplied to the gas amplifier. At 224, the gate valve associated with the filter is opened. At 226, fluid may be sprayed on the filter to increase humidity.

At 230, control determines whether the processing chamber temperature $T_{proc\_ch}$ is less than or equal to a desired temperature $T_{des}$. When the processing chamber temperature $T_{proc\_ch}$ is less than the desired temperature $T_{des}$, control turns off the compressed fluid to the gas amplifier at 234. At 236, control closes the gate valves. At 242, control pumps to base to remove any remaining reactants. The pumping to base can be performed by a conduit, a valve and a pump (not shown) controlled by the controller. At 246, control vents the processing chamber.

As can be appreciated, the cooling and reactant removal system includes very few moving parts. The gas amplifier draws large amounts of gas at ambient temperature into the processing chamber prior to required maintenance work. The gas exchange with the heated components in the substrate processing chamber enhances conductive cooling and selectively provides moisture that helps evacuate reactants such as fluorine. The output of the gas amplifier is directed into the scrubbed exhaust system so that the reactants are handled properly.

As can be further appreciated, the cooling and reactant removal system reduces down time by multiple hours. For example, for some substrate processing systems operating at 400 degrees Celsius, the estimated cooling time is expected to be reduced from approximately 6 hours to less than 2 hours. The cooling and reactant removal system can also be retrofit onto existing systems.

In some examples, the ratio of compressed fluid to total gas flow generated can be from 5:1 to 30:1. For example, the gas amplifier may flow approximately 600 slm at 65 psig of CDA flowing through the gas amplifier with a 25:1 amplification ratio. During cooling and reactant removal, a typical substrate processing system may use approximately 3 hours of CDA or $N_2$ at 680 slm or 24 scfm. The cost for the cooling will be on the order of $3/hour. The scrubbed exhaust system is designed to handle the temporary influx (such as about 600 scf) due to the additional flow.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term controller may be replaced with the term circuit. The term controller may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple controllers. The term group processor encompasses a processor that, in combination with additional processors, executes some or all code from one or more controllers. The term shared memory encompasses a single memory that stores some or all code from multiple controllers. The term group memory encompasses a memory that, in combination with additional memories, stores some or all code from one or more controllers. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A cooling and reactant removal system for a semiconductor processing system, comprising:
    a processing chamber defining a process volume and comprising one or more pedestals configured to support one or more substrates, respectively, for processing;
    a first gate valve having an inlet and an outlet, wherein the outlet of the first gate valve is arranged in fluid communication with the process volume of the processing chamber;
    a filter arranged in fluid communication with the inlet of the first gate valve;
    a second gate valve having an inlet and an outlet, wherein the inlet of the second gate valve is arranged in fluid communication with the process volume of the processing chamber;
    a gas amplifier having a first inlet, a second inlet, an outlet and at least one Coanda surface;
    a source of compressed gas, wherein the first inlet of the gas amplifier is in fluid communication with the compressed source of gas and wherein the compressed gas received at the first inlet is directed across the Coanda surface,
    wherein the second inlet of the gas amplifier is in fluid communication with the outlet of the second gate valve; and
    a scrubbed exhaust system, wherein the outlet of the gas amplifier is in fluid communication with the scrubbed exhaust system.

2. The cooling and reactant removal system of claim 1, further comprising a vent system to vent the processing chamber.

3. The cooling and reactant removal system of claim 1, further comprising a humidity system to selectively supply fluid to the filter during operation of the gas amplifier.

4. The cooling and reactant removal system of claim 3, wherein the humidity system comprises:
    a fluid supply;
    a valve in fluid communication with the fluid supply; and
    a nozzle in fluid communication with the valve and arranged to spray fluid from the fluid supply onto the filter.

5. The cooling and reactant removal system of claim 1, wherein the source of compressed gas supplies at least one of clean dry air, inert gas, atmospheric air and molecular nitrogen.

6. The cooling and reactant removal system of claim 5, wherein the source of compressed fluid operates between 50 and 100 psig.

7. The cooling and reactant removal system of claim 1, wherein the source of compressed gas operates at approximately 65 psig.

8. The cooling and reactant removal system of claim 7, wherein the gas amplifier operates at an amplification ratio between 8:1 and 37:1.

9. The cooling and reactant removal system of claim 1, further comprising:
   one or more heaters to heat the one or more pedestals, respectively;
   a controller configured to:
   turn off the heaters;
   vent the processing chamber;
   open the second gate valve;
   supply the compressed gas to the first inlet of the gas amplifier; and
   open the first gate valve.

10. The cooling and reactant removal system of claim 9, wherein the controller is further configured to:
    compare a temperature of the processing chamber to a predetermined temperature;
    based on the comparing:
    turning off the compressed gas to the gas amplifier; and
    closing the first and second gate valves.

11. A method for cooling and removing reactants from a semiconductor processing system including a processing chamber defining a process volume and including one or more pedestals configured to support one or more substrates, respectively, for processing, comprising:
    connecting an outlet of a first gate valve to the process volume of the processing chamber;
    connecting a filter to an inlet of the first gate valve;
    connecting an inlet of a second gate valve to the process volume of the processing chamber;
    connecting a first inlet of a gas amplifier to a source of compressed gas, wherein the compressed gas received at the first inlet is directed across a Coanda surface of the gas amplifier;
    connecting a second inlet of the gas amplifier to the outlet of the second gate valve; and
    connecting an outlet of the gas amplifier to a scrubbed exhaust system.

12. The method of claim 11, further comprising selectively venting the processing chamber.

13. The method of claim 11, further comprising selectively supplying liquid to the filter during operation of the gas amplifier.

14. The method of claim 11, wherein the source of compressed gas supplies at least one of clean dry air, inert gas, atmospheric air and molecular nitrogen.

15. The method of claim 14, wherein the source of compressed gas operates between 50 and 100 psig.

16. The method of claim 11, wherein the source of compressed gas operates at approximately in a range between 60 psig to 100 psig.

17. The method of claim 16, wherein the gas amplifier operates at an amplification ratio between 8:1 and 37:1.

18. The method of claim 11, further comprising:
    turning off heat to the pedestals;
    venting the processing chamber;
    opening the second gate valve;
    supplying the compressed gas to the first inlet of the gas amplifier; and
    opening the first gate valve.

19. The method of claim 18, further comprising:
    comparing a temperature of the processing chamber to a predetermined temperature; and
    based on the comparing:
    turning off the compressed gas to the gas amplifier; and
    closing the first and second gate valves.

20. The method of claim 19, further comprising:
    pumping to base pressure; and
    venting the processing chamber.

* * * * *